United States Patent
Xie et al.

(10) Patent No.: US 10,770,388 B2
(45) Date of Patent: Sep. 8, 2020

(54) TRANSISTOR WITH RECESSED CROSS COUPLE FOR GATE CONTACT OVER ACTIVE REGION INTEGRATION

(71) Applicant: International Business Machines Corporation, Armonk, NY (US)

(72) Inventors: Ruilong Xie, Schenectady, NY (US); Veeraraghavan S. Basker, Schenectady, NY (US); Kangguo Cheng, Schenectady, NY (US); Jia Zeng, Sunnyvale, CA (US); Youngtag Woo, San Ramon, CA (US); Mahender Kumar, San Jose, CA (US); Guillaume Bouche, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/009,200

(22) Filed: Jun. 15, 2018

(65) Prior Publication Data
US 2019/0385946 A1    Dec. 19, 2019

(51) Int. Cl.
*H01L 23/522* (2006.01)
*H01L 21/027* (2006.01)
(Continued)

(52) U.S. Cl.
CPC ...... *H01L 23/5221* (2013.01); *H01L 21/0276* (2013.01); *H01L 21/76805* (2013.01);
(Continued)

(58) Field of Classification Search
CPC ............... H01L 23/5221; H01L 23/535; H01L 21/0276; H01L 21/76805; H01L 21/76895;
(Continued)

(56) References Cited

U.S. PATENT DOCUMENTS

| 6,376,298 B1 * | 4/2002 | Li ..................... H01L 21/76897 257/E21.507 |
| 9,006,100 B2 | 4/2015 | Rashed et al. |

(Continued)

OTHER PUBLICATIONS

Carmona et al., Study of gate contact over active area, 2014 IEEE.

*Primary Examiner* — Seahvosh Nikmanesh
(74) *Attorney, Agent, or Firm* — Garg Law Firm, PLLC; Rakesh Garg; Joseph Petrokaitis

(57) ABSTRACT

A semiconductor structure includes a substrate having a first region and a second region, a first source/drain disposed on the substrate in the first region, an interlevel dielectric (ILD) disposed on the source/drain, and a first gate disposed on the substrate. The semiconductor structure further includes a first contact trench within the ILD extending to the first source/drain, a first trench contact within the first contact trench, and a first source/drain contact trench extending to the first trench contact. The semiconductor structure further includes a cross couple contact trench within the ILD, and a cross couple contact disposed in the cross couple contact trench in contact with the first gate and the first trench contact. The cross couple contact couples the first source/drain and the first gate.

9 Claims, 15 Drawing Sheets

Cross couple region 1404

Normal CA/CB region 1406

(51) Int. Cl.
*H01L 21/768* (2006.01)
*H01L 21/8234* (2006.01)
*H01L 27/088* (2006.01)
*H01L 23/535* (2006.01)
*H01L 27/11* (2006.01)

(52) U.S. Cl.
CPC ............. *H01L 21/76895* (2013.01); *H01L 21/823431* (2013.01); *H01L 21/823475* (2013.01); *H01L 23/535* (2013.01); *H01L 27/0886* (2013.01); *H01L 27/1104* (2013.01)

(58) Field of Classification Search
CPC ..... H01L 21/823431; H01L 21/823475; H01L 27/0886; H01L 27/1104
See application file for complete search history.

(56) References Cited

U.S. PATENT DOCUMENTS

| | | |
|---|---|---|
| 9,397,049 B1 | 7/2016 | Fan et al. |
| 9,461,143 B2 | 10/2016 | Pethe et al. |
| 9,735,242 B2 | 8/2017 | Xie et al. |
| 9,780,178 B2 | 10/2017 | Xie et al. |
| 9,818,651 B2 | 11/2017 | Bouche et al. |
| 9,824,921 B1 | 11/2017 | Labonte et al. |
| 9,842,927 B1 * | 12/2017 | Zang .................... H01L 29/783 |
| 10,109,637 B1 * | 10/2018 | Zang .................... H01L 27/1104 |
| 10,236,215 B1 * | 3/2019 | Xie .................... H01L 29/41791 |
| 2017/0053997 A1 | 2/2017 | Cheng et al. |
| 2017/0263715 A1 | 9/2017 | Bouche et al. |
| 2019/0206878 A1 * | 7/2019 | Chanemougame .......................... H01L 23/5226 |

\* cited by examiner

US 10,770,388 B2

TRANSISTOR WITH RECESSED CROSS COUPLE FOR GATE CONTACT OVER ACTIVE REGION INTEGRATION

TECHNICAL FIELD

The present invention relates generally to a method for fabricating a transistor and a structure formed by the method. More particularly, the present invention relates to a method for fabricating a transistor with a recessed cross couple that is compatible with gate contact over active region integration.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

Many semiconductor devices are planar, i.e., where the semiconductor structures are fabricated on one plane. A non-planar device is a three-dimensional (3D) device where some of the structures are formed above or below a given plane of fabrication.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material. A fin-Field Effect Transistor (finFET) is a non-planar device in which a source and a drain are connected using a fin-shaped conducting channel (fin). Generally, a finFET is fabricated as a multi-gate device in which two or more gates are coupled using one or more fin structures.

SUMMARY

The illustrative embodiments provide a method and apparatus. An embodiment of a method of fabricating a transistor includes receiving a semiconductor structure including a substrate having a first region and a second region. In the embodiment, the first region includes a first source/drain disposed on the substrate, a first interlevel dielectric (ILD) disposed on the first source/drain, a first gate disposed on the substrate, a first cap disposed on the first gate, and a first spacer disposed between the first source drain and the first gate. The embodiment further includes depositing a first lithographic patterning material layer on the semiconductor structure, and forming a first contact trench within the first lithographic patterning material layer and the first ILD extending to the first source/drain.

The embodiment further includes forming a first trench contact within the first contact trench, depositing a second ILD on the semiconductor structure; and etching the second ILD and the first cap to form a first source/drain contact trench extending to the first trench contact. The embodiment further includes depositing a second lithographic patterning material layer upon the second ILD and within the first source/drain contact trench, and forming a cross couple contact trench within the second lithographic patterning material layer and the second ILD. The embodiment further includes removing the second lithographic patterning material layer, and depositing a first contact material in the cross couple contact trench in contact with the first gate and the first trench contact to form a cross couple contact. In the embodiment, the cross couple contact couples the first source/drain and the first gate.

In an embodiment, forming the first contact trench within the first lithographic patterning material layer and the first ILD further includes etching the first lithographic patterning material layer and the first ILD to form the first contact trench.

In an embodiment, forming the first trench contact upon the first source/drain includes depositing a trench contact material in the first contact trench, and recessing the trench contact material to form the first trench contact upon the first source/drain.

In an embodiment, forming the cross couple contact trench includes depositing an anti-reflective coating material layer on the second first lithographic patterning material layer, and applying a photoresist layer to the anti-reflective coating material layer. The embodiment further includes etching the photoresist layer, the second lithographic patterning material layer, and the second ILD in the first region to form a first portion of the cross couple contact trench.

In an embodiment, forming the cross couple contact trench further includes etching the second ILD in the first region to form a second portion of the cross couple contact trench. In an embodiment, forming the cross couple contact trench further includes removing the first cap to form the cross couple contact trench in the first region.

In an embodiment, forming the cross couple contact from the first contact material includes applying a mask to the second region, recessing the cross couple contact material to form the cross couple contact, and removing the mask from the second region.

An embodiment further includes depositing an ILD fill upon the semiconductor structure, and forming a first metallization layer within the ILD fill of the first region. In the embodiment, the first metallization layer is electrically isolated from the cross couple contact.

An embodiment further includes eroding a corner of the first spacer prior to the forming of the trench contact. An embodiment further includes forming a second contact trench within the first lithographic patterning material layer and the first ILD extending to a second source/drain of the second region, and forming a second trench contact within the second contact trench.

In an embodiment, the first lithographic patterning material layer is an organic planarization layer.

An embodiment of an apparatus includes a semiconductor structure including a substrate having a first region and a second region, a first source/drain disposed on the substrate in the first region, an interlevel dielectric (ILD) disposed on the source/drain, and a first gate disposed on the substrate. The embodiment further includes a first contact trench within the ILD extending to the first source/drain, a first trench contact within the first contact trench, and a first source/drain contact trench extending to the first trench contact. The embodiment further includes a cross couple contact trench within the ILD, and a cross couple contact disposed in the cross couple contact trench in contact with the first gate and the first trench contact. In the embodiment, the cross couple contact couples the first source/drain and the first gate.

An embodiment further includes a first cap disposed on the first gate. Another embodiment further includes a first spacer disposed between the first source drain and the first gate. Another embodiment further includes an ILD fill upon the semiconductor structure, and a first metallization layer within the ILD fill of the first region, wherein the first metallization layer is electrically isolated from the cross couple contact.

An embodiment further includes a second source/drain disposed on the substrate in the second region, a second contact trench within the ILD extending to the second source/drain, and a second trench contact within the second contact trench.

An embodiment includes a computer usable program product. The computer usable program product includes one or more computer-readable storage devices, and program instructions stored on at least one of the one or more storage devices.

In an embodiment, the computer usable code is stored in a computer readable storage device in a data processing system, and wherein the computer usable code is transferred over a network from a remote data processing system.

In an embodiment, the computer usable code is stored in a computer readable storage device in a server data processing system, and wherein the computer usable code is downloaded over a network to a remote data processing system for use in a computer readable storage device associated with the remote data processing system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
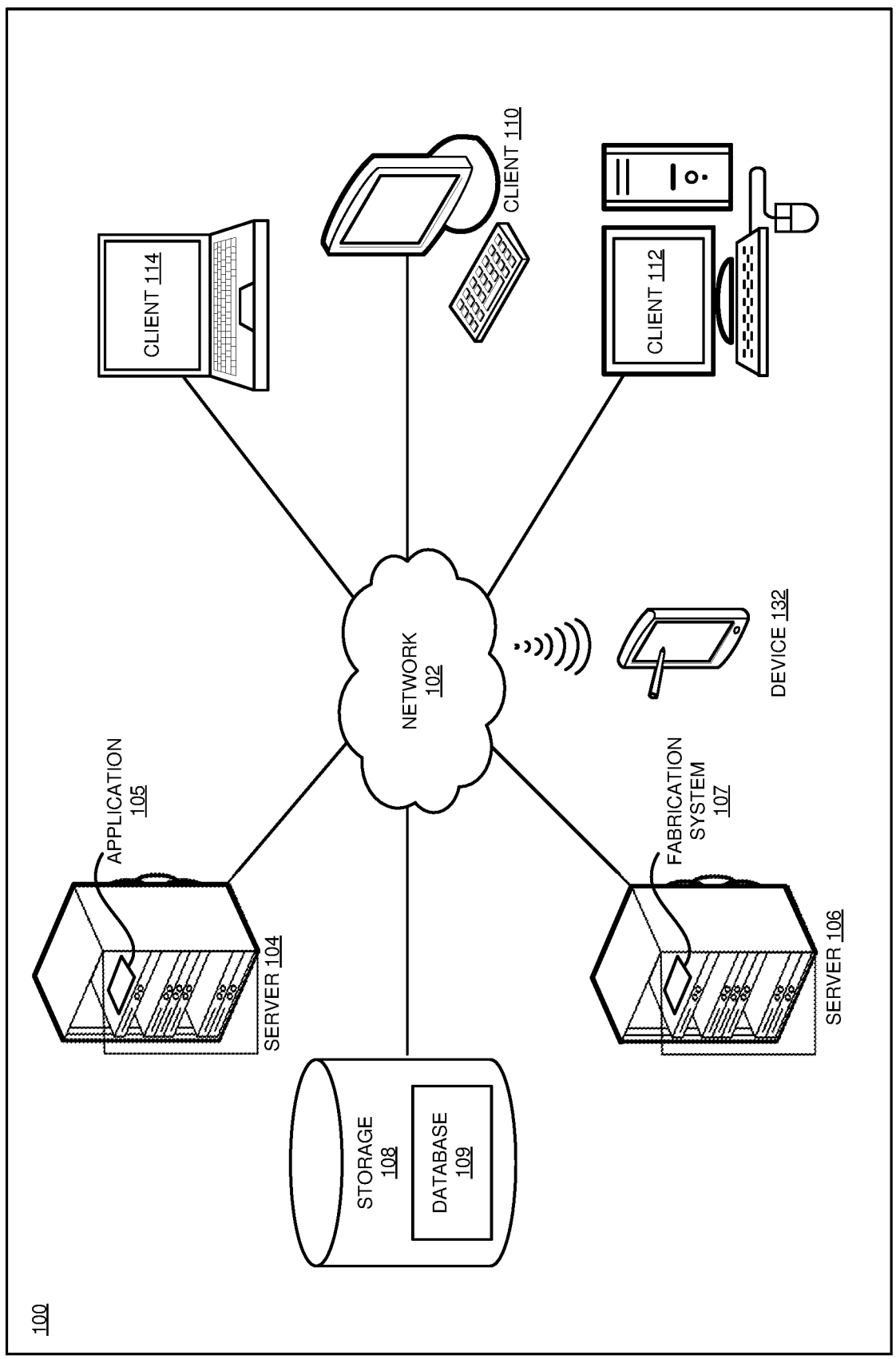
FIG. 1 depicts a block diagram of a network of data processing systems in which illustrative embodiments may be implemented.

The illustrative embodiments relate to a method for fabricating a transistor with a recessed cross couple which is compatible with gate contact over active region integration and a structure formed by the method. The illustrative embodiments recognize that the present methods and techniques for fabricating transistors suffer from several problems.

Cross coupling structures, such as a static random-access memory (SRAM) cross couple, are used to interconnect a source/drain region of one pair of inverters to the gate of the other pair of inverters. However, it is not straightforward to integrate the gate contact over active region (CBoA) and a cross coupling structure together because the cross couple (XC) needs the source/drain (S/D) to short with the gate whereas CBoA conventionally prevents S/D shorting to the gate. Using an upper source/drain (S/D) contact-gate contact cross couple (XC) to enable co-existence of CBoA and XC in a semiconductor device may block the metal line layer above (MO) the contact of the semiconductor device. Using an upper source/drain contact/gate contact-metallization layer cross couple to enable co-existence of CBoA and XC may not enable fabrication of an MO layer of sufficient area. Using a mask to fabrication a lower gate contract cross couple to a trench contact (i.e., a lower S/D contact) requires the use of two critical masks thus imposes a high cost due to the utilization of the two masks as well as a requirement to use two metallization layers.

Various embodiments described herein provide for a method and structure for forming transistors, such as a MOSFET transistor, with a recessed cross couple for gate contact over active region integration that are not subject to the above described problems encountered during conventional fabrication of transistors having a cross couple.

One or more embodiments described herein provide for fabricating a transistor with a recessed cross couple for gate contact over active region integration. An embodiment includes a stitch structure for a semiconductor device having a recessed upper S/D contact/gate contact cross couple. One or more embodiments provide for a transistor structure that enables CBoA and is also compatible with a cross couple and does not touch top metal lines of the semiconductor structure.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate transistors having robust air spacers.

For the clarity of the description, and without implying any limitation thereto, the illustrative embodiments are described using a particular FinFET structure having a particular number of fins and gates. An embodiment can be implemented with a different number of gates, different number of fins, or both, within the scope of the illustrative embodiments, and can be used for planar device, or other device architectures like nanowire, and nanosheet devices as well.

Furthermore, simplified diagrams of the example transistors are used in the figures and the illustrative embodiments. In an actual fabrication of a transistor, additional structures that are not shown or described herein may be present without departing the scope of the illustrative embodiments. Similarly, within the scope of the illustrative embodiments, a shown or described structure in the example transistors may be fabricated differently to yield a similar operation or result as described herein.

Differently shaded portions in the two-dimensional drawing of the example transistors are intended to represent different structures in the example transistors, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating transistors according to the illustrative embodiments.

Furthermore, the illustrative embodiments are described with respect to transistors only as an example. The steps described by the various illustrative embodiments can be adapted for fabricating other planar and non-planar devices in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating transistor devices. An embodiment provides a method for fabricating transistors.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
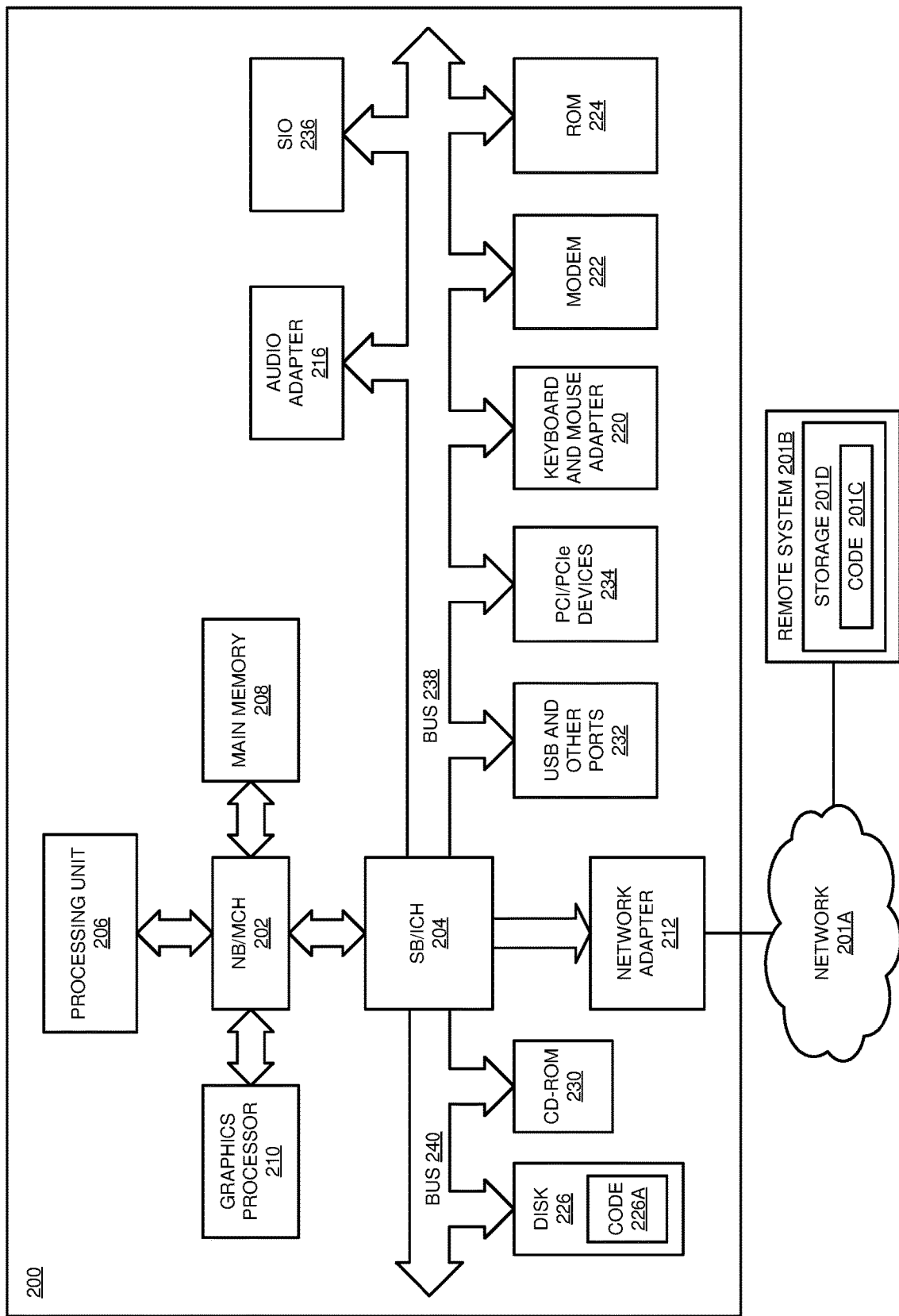
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be Implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more transistors in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-15, these figures depict portions of an example process for fabricating a transistor with a recessed cross couple for gate contact over active region integration in accordance with one or more illustrative embodiments.

In the particular embodiments illustrated in FIGS. 3-15, In the embodiments illustrated in FIGS. 3-15, the figures at the top right corner specify a topdown layout view of the devices and the two figures at the bottom left and right show a cross-section view of the devices along a direction X. In the illustrated embodiments, the left device has at least one cross-coupling contact, and the right device has at least one gate contact over active region. It should be noted that the number of gates in the topdown view may not be the same as the number of gates in one or more of the cross-section views. In addition, it should be understood that one or more embodiments are not limited to the number of gates or contacts shown but may include any number of gates or contacts. It should be understood that in other embodiments, any combination of transistors or other combinations of any numbers of semiconductor devices, may be fabricated on a substrate in a similar manner.

Figure 3:
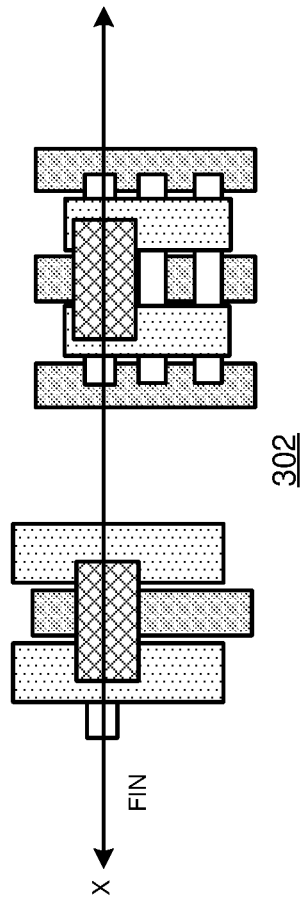
FIG. 3 depicts a cross-section view of a portion of a process for fabricating a transistor in which a structure is formed according to an illustrative embodiment.
Figure 3:
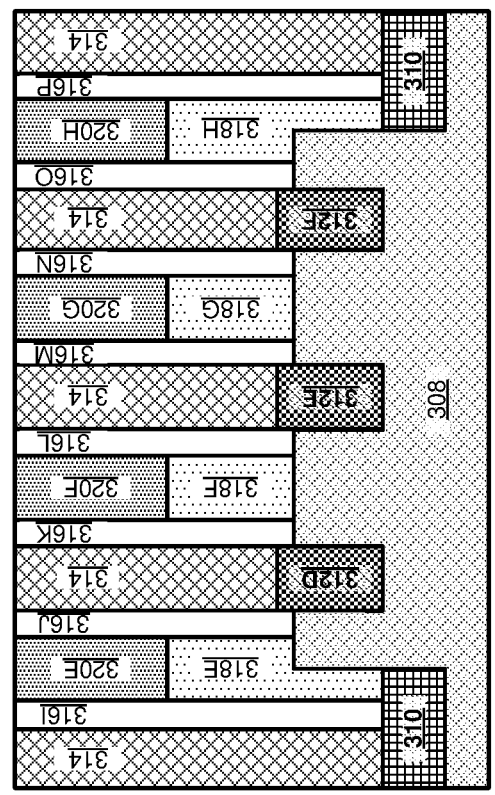
Figure 3:
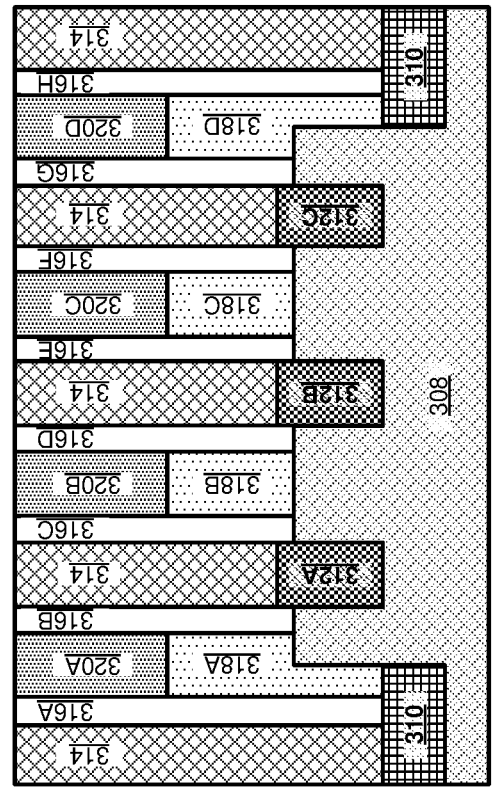

With reference to FIG. 3, this figure depicts a cross-section view of a portion of a process for fabricating a transistor in which a structure 300 is formed according to an illustrative embodiment. Structure 300 includes a cross couple region 304 and a normal S/D contact/gate contact (CA/CB) region 306. In one or more embodiments, normal S/D contact/gate contact (CA/CB) region 306 is a non-cross couple region. FIG. 3 shows a top view 302 of structure 300, a cross-section view of cross couple region 304, and a cross-section view of normal CA/CB region 306. In the embodiment, fabrication system 107 receives structure 300. Structure 300 includes a substrate 308 and a shallow trench isolation (STI) layer 310 disposed within trenches of substrate 308 at which isolates the FINs and also separates different active regions for each of cross couple region 304 and normal CA/CB region 306. In a particular embodiment, substrate 308 is formed of a silicon (Si) material.

Structure 300 further includes source/drain (S/D) epitaxies 312A-312C disposed within substrate 308 of cross couple region 304, and S/D epitaxies 312D-312F disposed within substrate 308 of normal CA/CB region 306. Structure 300 further includes an interlayer dielectric (ILD) 314 disposed upon the S/D epitaxies and STI layer 310 for each of cross couple region 304 and normal CA/CB region 306.

Structure 300 further includes a first spacer 316A, a second spacer 316B, a third spacer 316C, a fourth spacer 316D, a fifth spacer 316E, a sixth spacer 316F, a seventh spacer 316G, and an eight spacer 316H within cross couple region 304. Structure 300 further includes a ninth spacer 316I, a tenth spacer 316J, an eleventh spacer 316K, a twelfth spacer 316L, a thirteenth spacer 316M, a fourteenth spacer 316N, a fifteenth spacer 316O, and an sixteenth spacer 316P within normal CA/CB region 306. In a particular embodiment, spacers 316A-316P are formed of a silicon oxycarbonitride (SiOCN) material.

Structure 300 further includes a first gate 318A disposed at an edge of the active region, a second gate 318B disposed on the active region, a third gate 318C disposed on the active region, and a fourth gate 318D disposed on the edge of the active region of the cross couple region 304. Structure 300 further includes a fifth gate 318E disposed upon an edge of the active region, a sixth gate 318F disposed on the active region, a seventh gate 318G disposed on the active region, and an eighth gate 318H disposed upon an edge of the active region of normal CA/CB region 306. In a particular embodiment, gates 318A-318H are formed of a high-k metal gate (HKMG) material.

Structure 300 further includes a first self-aligned contact (SAC) cap 320A disposed on first gate 318A, a second SAC cap 320B disposed on second gate 318B, a third SAC cap 320C disposed on third gate 318C, a fourth SAC cap 320D disposed on fourth gate 318D, a fifth SAC cap 320E disposed on fifth gate 318E, a sixth SAC cap 320F disposed on sixth gate 318F, a seventh SAC cap 320G disposed on seventh gate 318G, and an eighth SAC cap 320H disposed on eighth gate 318H. In a particular embodiment, SAC caps 320A-320H are formed of a silicon nitride (SiN) material.

In the embodiment, first spacer 316A is disposed between portions of ILD 314 and first gate 318A/first SAC cap 320A, second spacer 316B is disposed between portions of first gate 318A/first SAC cap 320A and first S/D epitaxy 312A/ILD 314, third spacer 316C is disposed between portions of first S/D epitaxy 312A/ILD 314 and second gate 318B/second SAC cap 320B, fourth spacer 316D is disposed between second gate 318B/second SAC cap 320B and second S/D epitaxy 312B/ILD 314, fifth spacer 316E is disposed between second S/D epitaxy 312B/ILD 314 and third gate 318C/third SAC cap 320C, sixth spacer 316F is disposed between third gate 318C/third SAC cap 320C and third S/D epitaxy 312C/ILD 314, seventh spacer 316G is disposed between third S/D epitaxy 312C/ILD 314 and fourth gate 318D/fourth SAC cap 320D, and eighth spacer 316H is disposed between fourth gate 318D/fourth SAC cap 320D and ILD 314 of cross couple region 304.

In the embodiment, ninth spacer 316I is disposed between portions of ILD 314 and fifth gate 318E/fifth SAC cap 320E, tenth spacer 316J is disposed between portions of fifth gate 318E/fifth SAC cap 320E and fourth S/D epitaxy 312D/ILD 314, eleventh spacer 316K is disposed between portions of fourth S/D epitaxy 312D/ILD 314 and sixth gate 318F/sixth SAC cap 320F, twelfth spacer 316L is disposed between sixth gate 318F/sixth SAC cap 320F and fifth S/D epitaxy 312E/ILD 314, thirteenth spacer 316M is disposed between fifth S/D epitaxy 312E/ILD 314 and seventh gate 318G/seventh SAC cap 320G, fourteenth spacer 316N is disposed between seventh gate 318G/seventh SAC cap 320G and sixth S/D epitaxy 312F/ILD 314, fifteenth spacer 316O is disposed between sixth S/D epitaxy 312F/ILD 314 and eighth gate 318H/eighth SAC cap 320H, and sixteenth spacer 316P is disposed between eighth gate 318H/eighth SAC cap 320H and ILD 314 of normal CA/CB region 306. In the embodiment, fabrication system 107 further performs a chemical mechanical planarization (CMP) process to planarize the top surface of structure 300.

Figure 4:
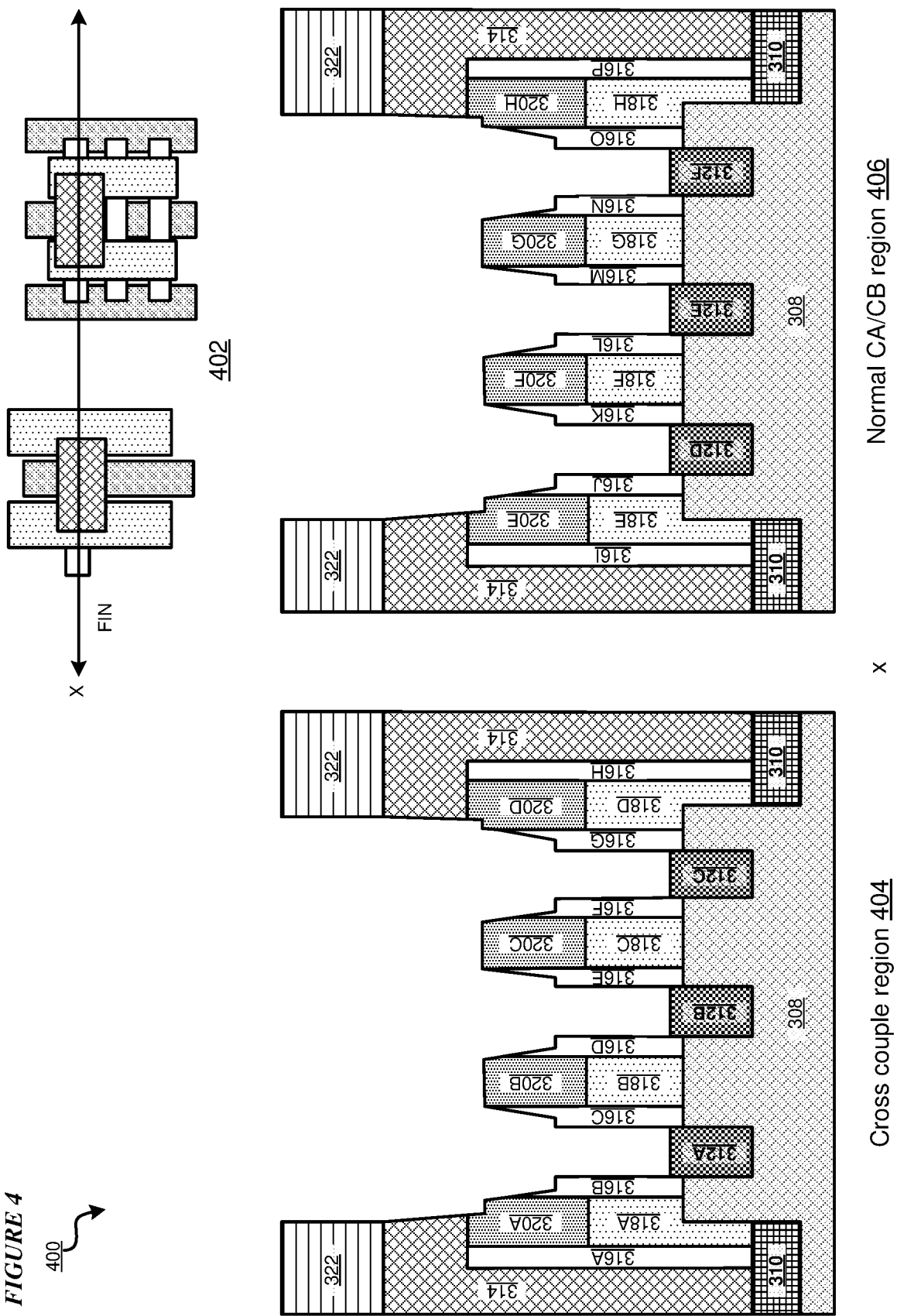
FIG. 4 depicts a cross-section view of another portion of the process in which a structure is formed according to an illustrative embodiment.

With reference to FIG. 4, this figure depicts a cross-section view of another portion of the process in which a structure 400 is formed according to an illustrative embodiment. FIG. 4 shows a top view 402 of structure 400, a cross-section view of cross couple region 404, and a cross-section view of normal CA/CB region 406. In the embodiment, fabrication system 107 deposits additional ILD which is the same material as ILD 314 over structure 300, and a lithographic patterning stack material 322, followed by patterning the trench contact (i.e., the lower S/D contact) using a lithography and etch process. In a particular embodiment, lithographic patterning stack material 322 is an organic planarization layer (OPL). In the embodiment, the etch process opens lithographic patterning stack material 322 followed by etching the ILD material 314 to form contact trenches extending to each of S/D epitaxies 312A-312F in cross couple region 404 and normal CA/CB region 406. In a particular embodiment, lithographic patterning material 322 is an organic planarization layer (OPL). In the embodiment, fabrication system 107 etches lithographic patterning stack material 322 and ILD 314 using a reactive-ion etching (RIE) process. In the embodiment, fabrication system 107 erodes a corner of each of spacers 316B-316G of cross couple region 404 and a corner of each of spacers of 316J-316O of normal CA/CB region 406. In the embodiment, fabrication system 107 further erodes a corner of each of SAC caps 320A, 320D, 320E, and 320J.

Figure 5:
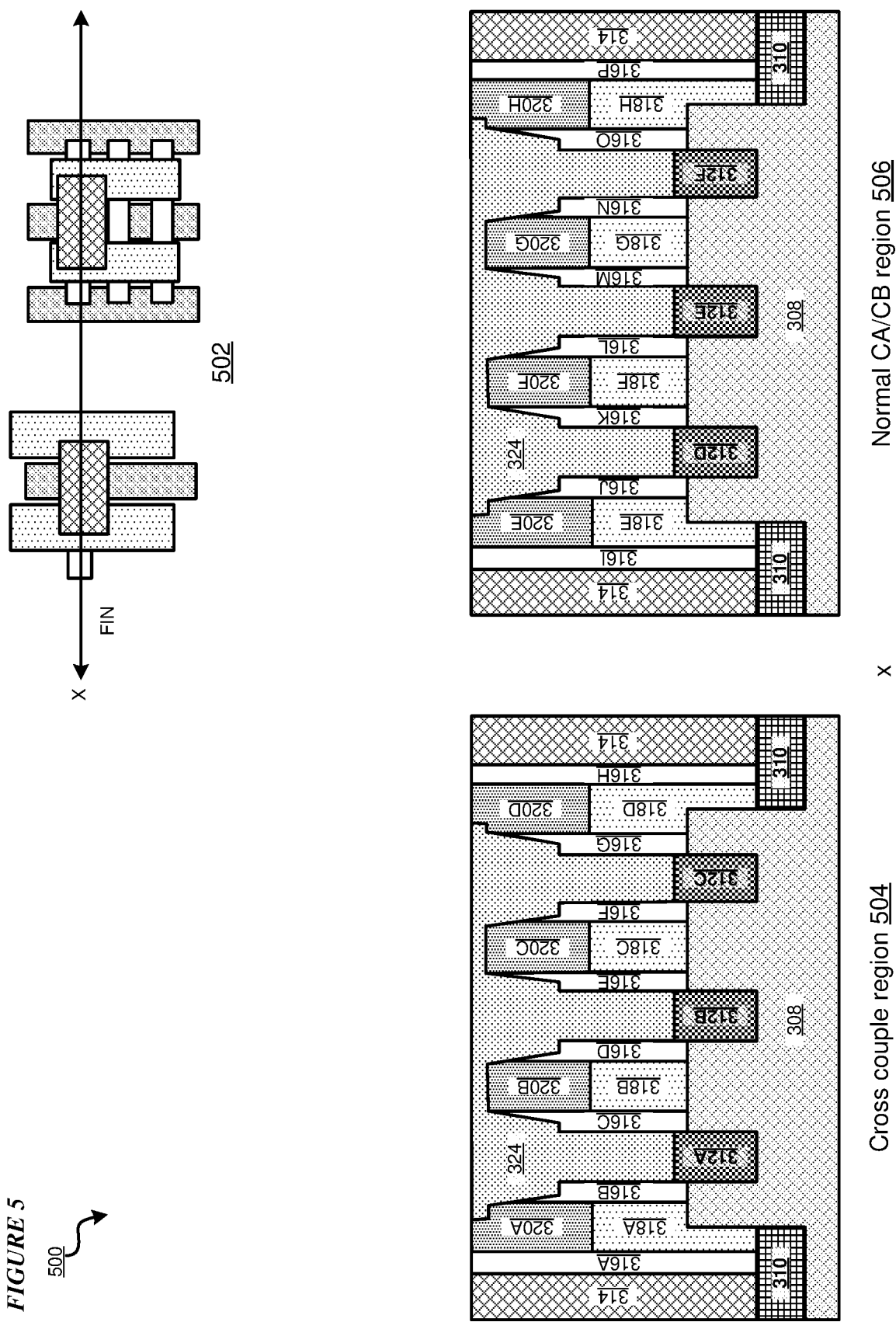
FIG. 5 depicts a cross-section view of another portion of the process in which a structure is formed according to an illustrative embodiment.

With reference to FIG. 5, this figure depicts a cross-section view of another portion of the process in which a structure 500 is formed according to an illustrative embodiment. FIG. 5 shows a top view 502 of structure 500, a cross-section view of cross couple region 504, and a cross-section view of normal CA/CB region 506. In the embodiment, fabrication system 107 deposits a trench contact material 324 in the trenches in contact with each of first S/D epitaxy 312A, second S/D epitaxy 312B, third S/D epitaxy 312C, fourth S/D epitaxy 312D, fifth S/D contact 312E, and sixth S/D epitaxy 312F to metallize contacts 312A-312F. In a particular embodiment, trench contact material 324 includes a metal liner, such as Ti, TiN and a bulk metal fill such as cobalt (Co), Ruthenium (Ru) or tungsten (W). In the embodiment, fabrication system 107 planarizes trench contact material 324 using a CMP process.

Figure 6:
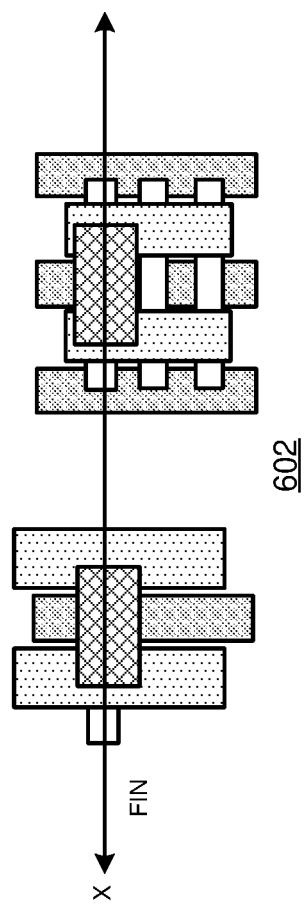
FIG. 6 depicts a cross-section view of another portion of the process in which a structure is formed according to an illustrative embodiment.
Figure 6:
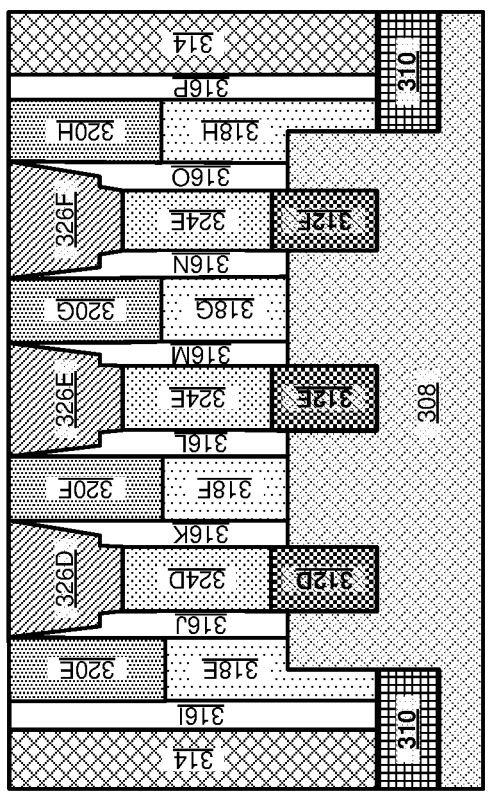
Figure 6:
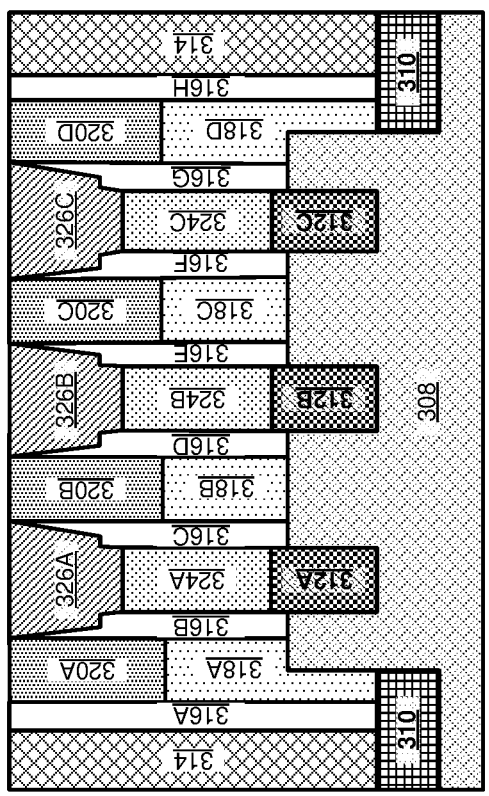

With reference to FIG. 6, this figure depicts a cross-section view of another portion of the process in which a structure 600 is formed according to an illustrative embodiment. FIG. 6 shows a top view 602 of structure 600, a cross-section view of cross couple region 604, and a cross-section view of normal CA/CB region 606. In the embodiment, fabrication system 107 recesses trench contact material 324 to form a first trench contact 324A upon first S/D epitaxy 312A, a second trench contact 324B upon second S/D epitaxy 312B, a third trench contact 324C upon third S/D epitaxy 312C, a fourth trench contact 324D upon fourth S/D epitaxy 312D, a fifth trench contact 324E upon fifth S/D epitaxy 312E, and a sixth trench contact 324F upon sixth S/D epitaxy 312F. In the embodiment, fabrication system 107 forms a first trench contact cap 326A on first trench contact 324A, a second trench contact cap 326B on second trench contact 324B, a third trench contact cap 326C on third trench contact 324C, a fourth trench contact cap 326D on fourth trench contact 324D, a fifth trench contact cap 326E on fifth trench contact 324E, and a sixth trench contact cap 326F on sixth trench contact 324F. In a particular embodiment, trench contacts 324A-324F are formed of a silicon carbide (SiC) material, silicon oxycarbide (SiCO), silicon dioxide (SiO2), or a combination of multiple liners of above materials.

Figure 7:
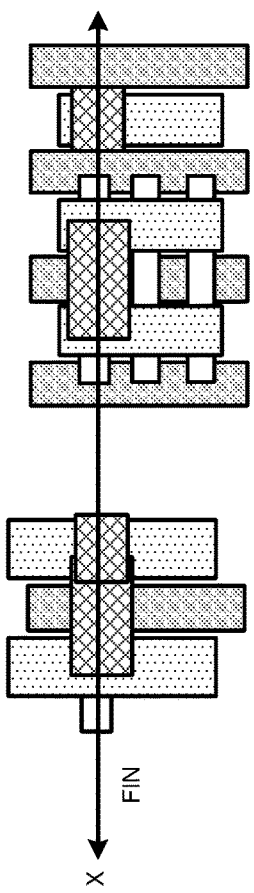
FIG. 7 depicts a cross-section view of another portion of the process in which a structure is formed according to an illustrative embodiment.
Figure 7:
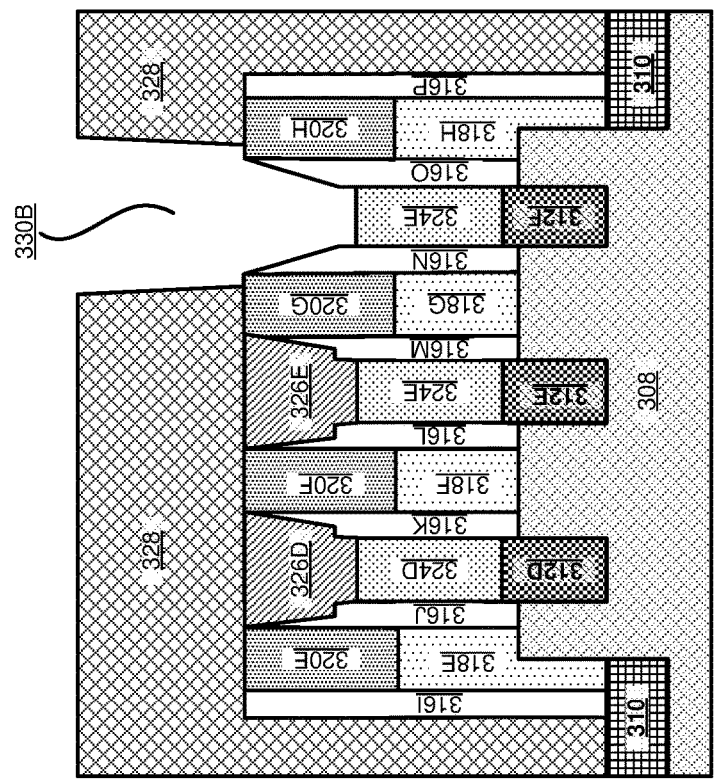
Figure 7:
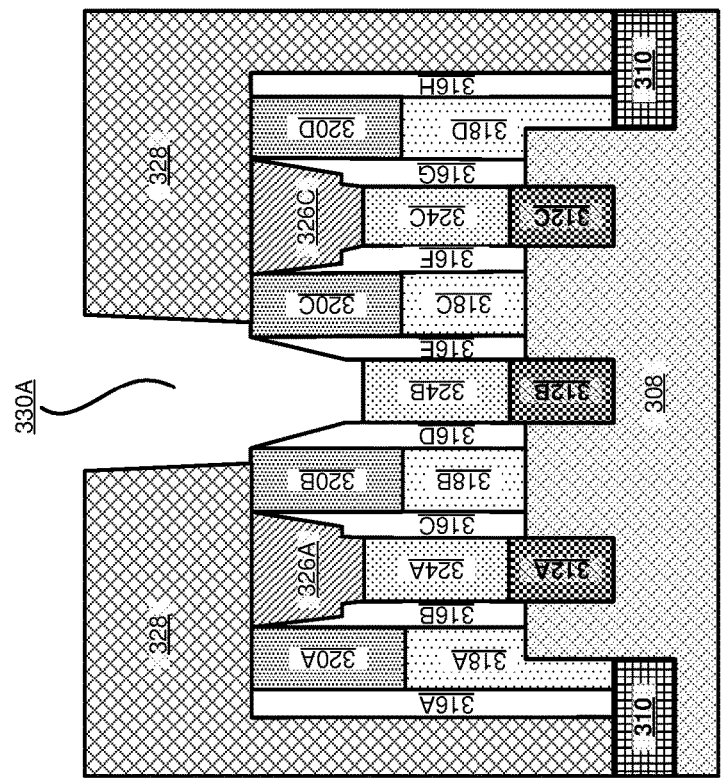

With reference to FIG. 7, this figure depicts a cross-section view of another portion of the process in which a structure 700 is formed according to an illustrative embodiment. FIG. 7 shows a top view 702 of structure 700, a cross-section view of cross couple region 704, and a cross-section view of normal CA/CB region 706. In the embodiment, fabrication system 107 deposits a second ILD 328 on structure 600 of FIG. 6. In the embodiment, fabrication system 107 etches second ILD 328 and second trench contact cap 326B to form a first upper source/drain contact (CA) trench 330A to second trench contact 324B of cross couple region 704. In the embodiment, fabrication system 107 etches second ILD 328 and sixth trench contact cap 326F to form a second source/drain contact (CA) trench 330B to sixth trench contact 324F of normal CA/CB region 706. In a particular embodiment, fabrication system 107 forms first S/D contact (CA) trench 330A and second S/D contact (CA) trench 330B using an RIE process to etch oxide and SiC selective to SiN.

Figure 8:
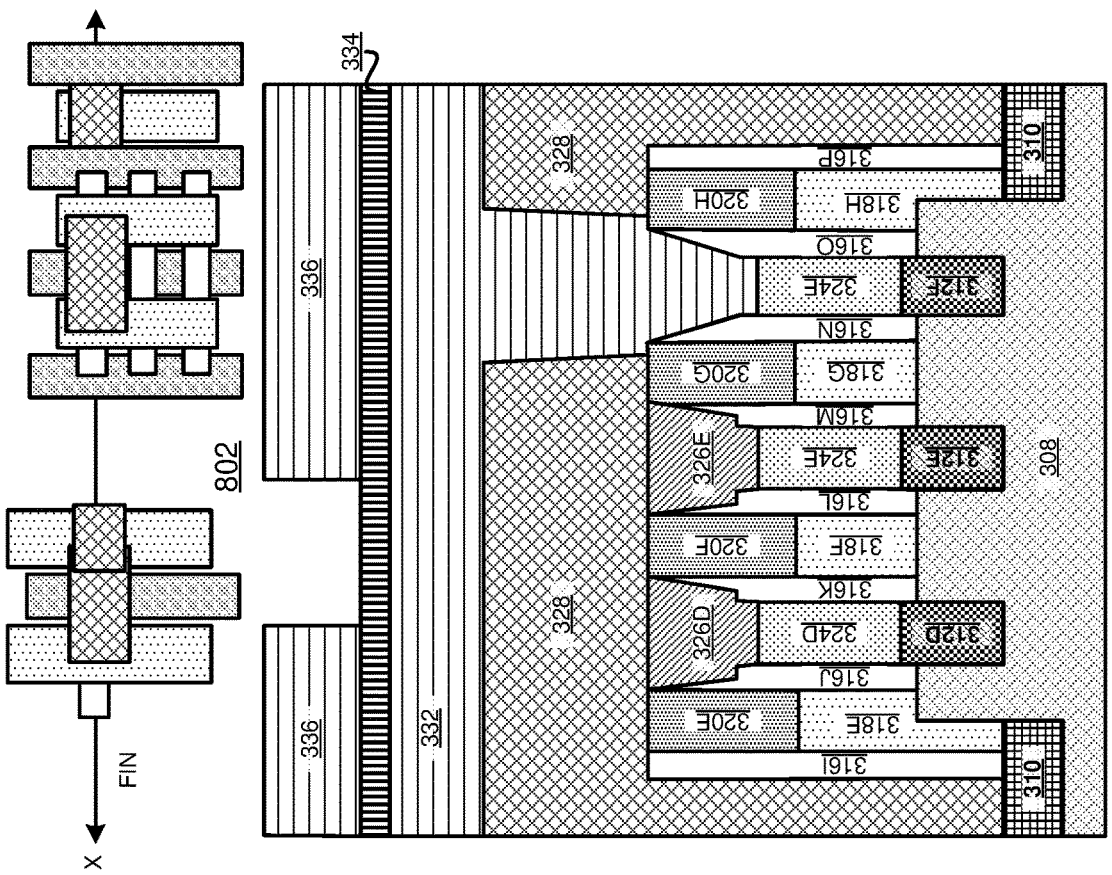
FIG. 8 depicts a cross-section view of another portion of the process in which a structure is formed according to an illustrative embodiment.
Figure 8:
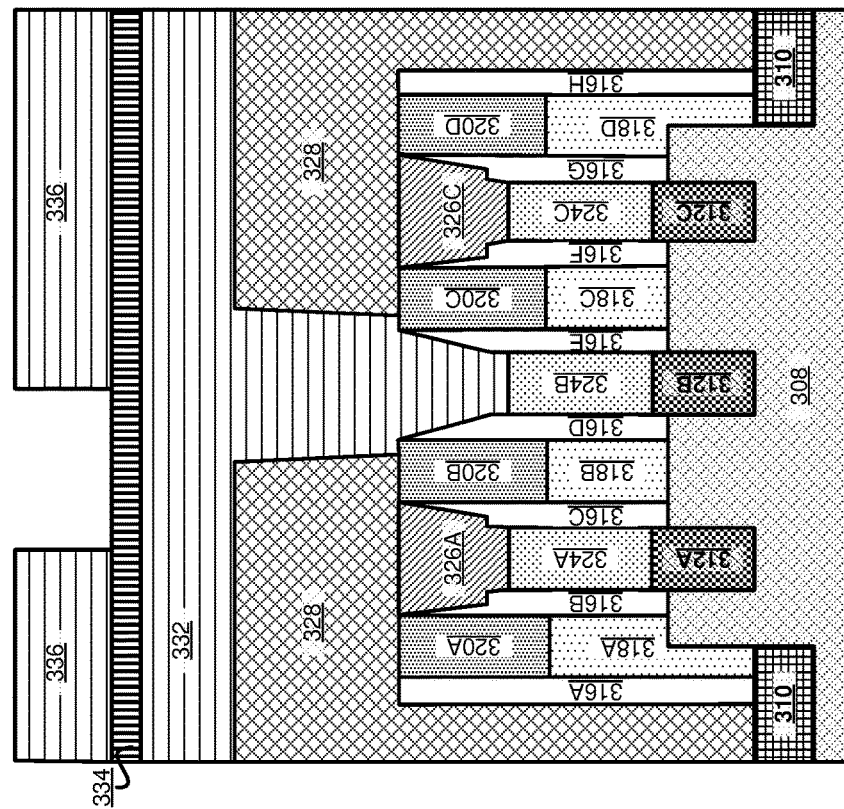

With reference to FIG. 8, this figure depicts a cross-section view of another portion of the process in which a structure 800 is formed according to an illustrative embodiment. FIG. 8 shows a top view 802 of structure 800, a cross-section view of cross couple region 804, and a cross-section view of normal CA/CB region 806. In the embodiment, fabrication system 107 deposits a second lithographic patterning stack 332 upon second ILD 328 and within first S/D contact (CA) trench 330A and second S/D contact (CA) trench 330B. In a particular embodiment, second lithographic patterning stack 332 is an OPL. In the embodiment, fabrication system 107 further deposits an anti-reflective coating (ARC) material layer 334 on second lithographic patterning stack 332. In particular embodiments, ARC material layer 334 can include SiARC, TiARC, TiO2, or SiON. In the embodiment, fabrication system 107 further applies a first photo resist layer 336 over ARC material layer 334. In the embodiment, fabrication system 107 applies a lithography exposure and development process to remove unwanted portions of first photo resist layer 336.

Figure 9:
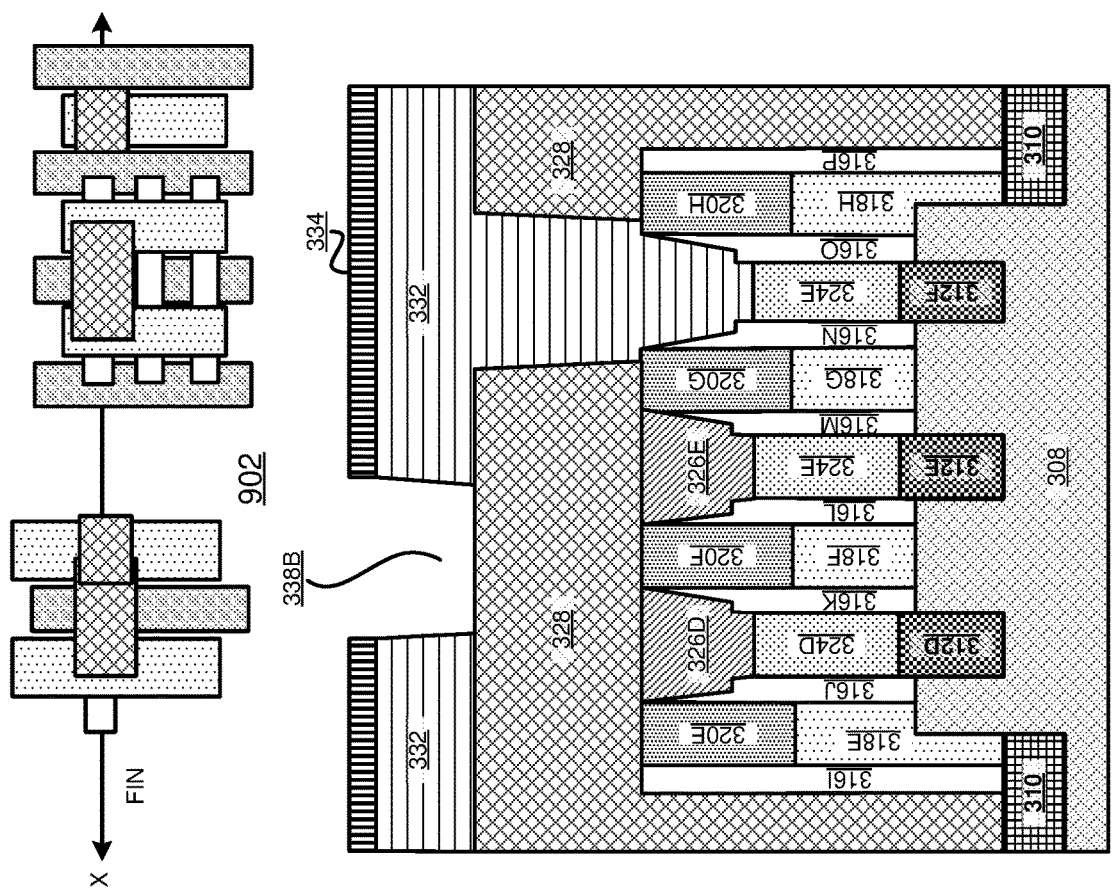
FIG. 9 depicts a cross-section view of another portion of the process in which a structure is formed according to an illustrative embodiment.
Figure 9:
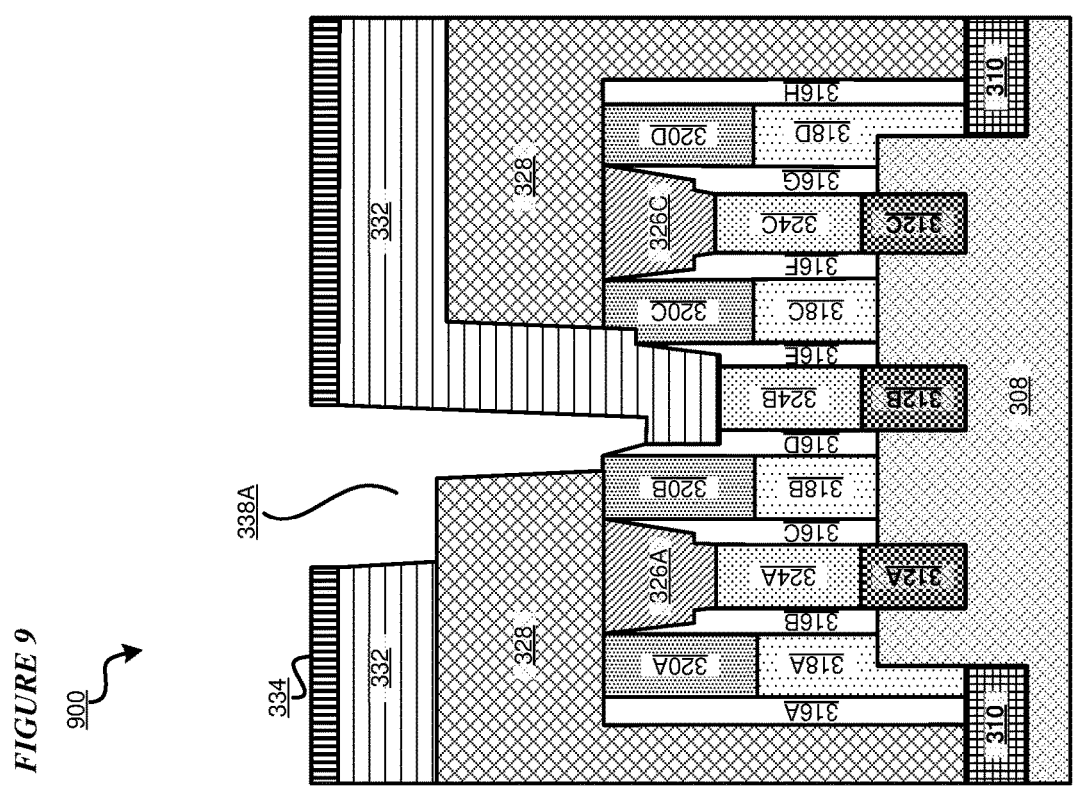

With reference to FIG. 9, this figure depicts a cross-section view of another portion of the process in which a structure 900 is formed according to an illustrative embodiment. FIG. 9 shows a top view 902 of structure 900, a cross-section view of cross couple region 904, and a cross-section view of normal CA/CB region 906. In the embodiment, fabrication system 107 etches ARC material layer 334 and second lithographic patterning stack 332.

Figure 10:
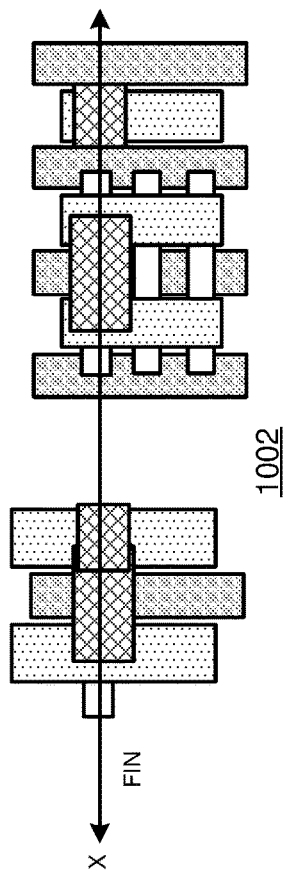
FIG. 10 depicts a cross-section view of another portion of the process in which a structure is formed according to an illustrative embodiment.
Figure 10:
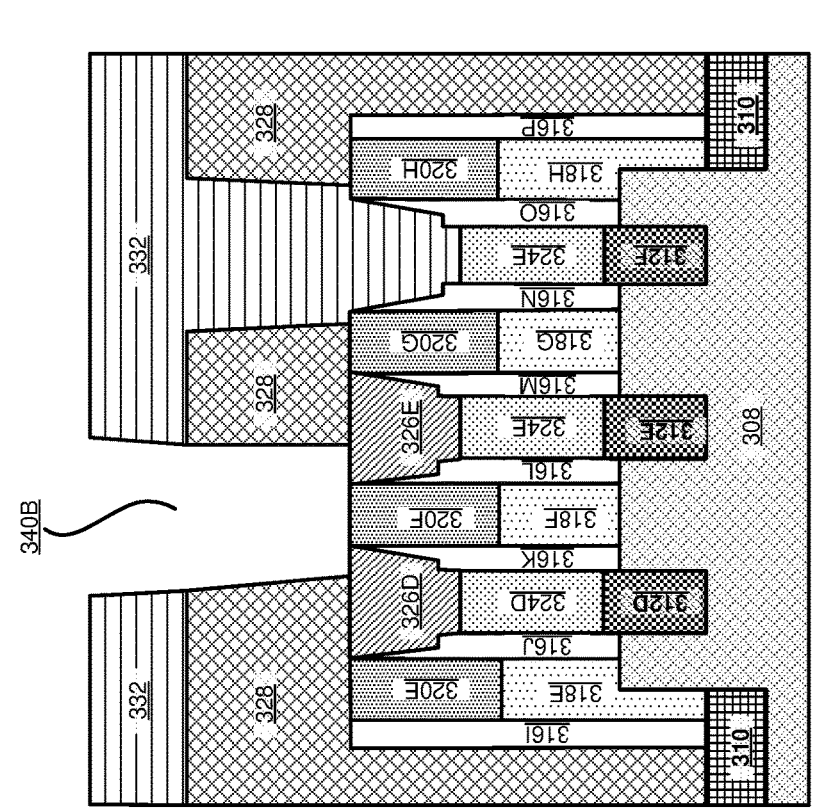
Figure 10:
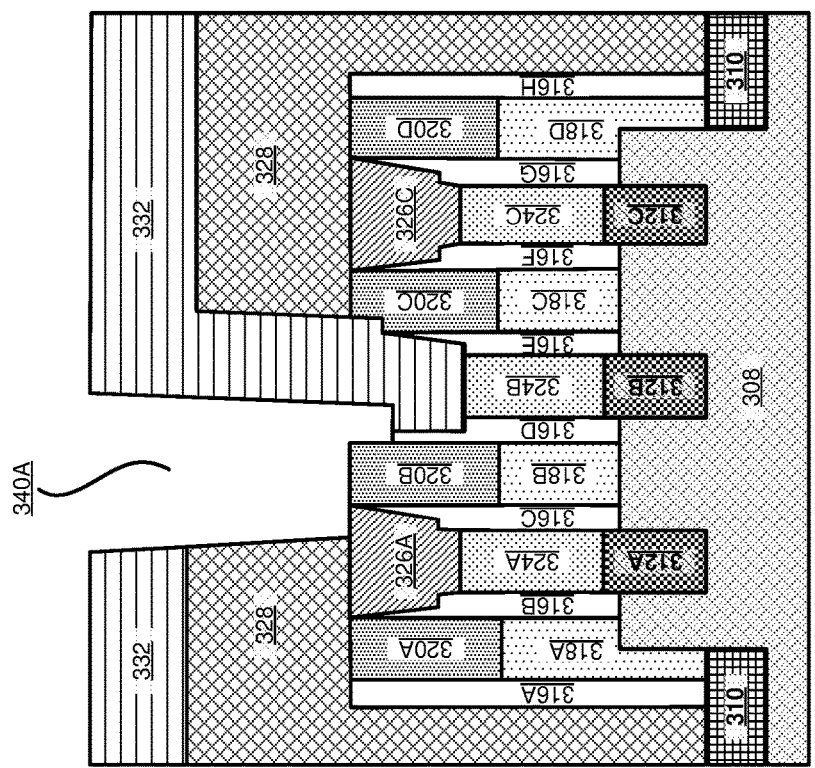

With reference to FIG. 10, this figure depicts a cross-section view of another portion of the process in which a structure 1000 is formed according to an illustrative embodiment. FIG. 10 shows a top view 1002 of structure 1000, a cross-section view of cross couple region 1004, and a cross-section view of normal CA/CB region 1006. In the embodiment, fabrication system 107 further etches second ILD 328 to form a cross couple contact trench portion 340A in cross couple region 1004. In the embodiment, fabrication system 107 etches second ILD 328 to form a gate contact trench portion 340B in normal CA/CB region 1006. In at least one embodiment, during the ILD etch, ARC material layer 334 is also etched away.

Figure 11:
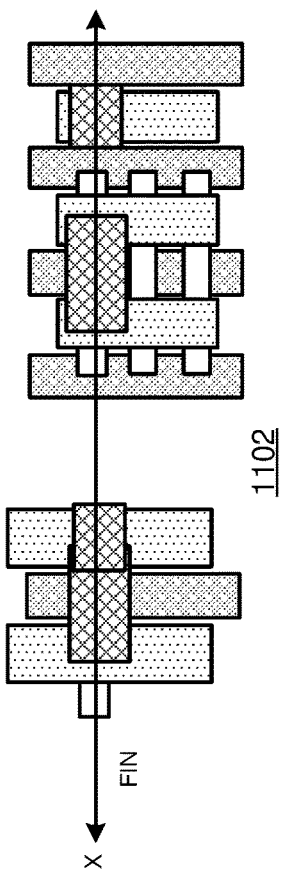
FIG. 11 depicts a cross-section view of another portion of the process in which a structure is formed according to an illustrative embodiment.
Figure 11:
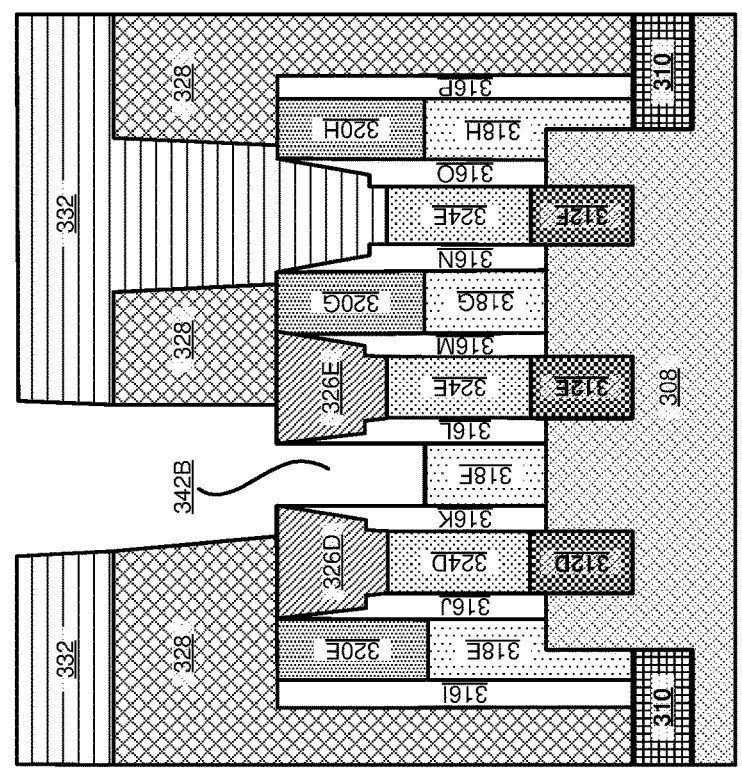
Figure 11:
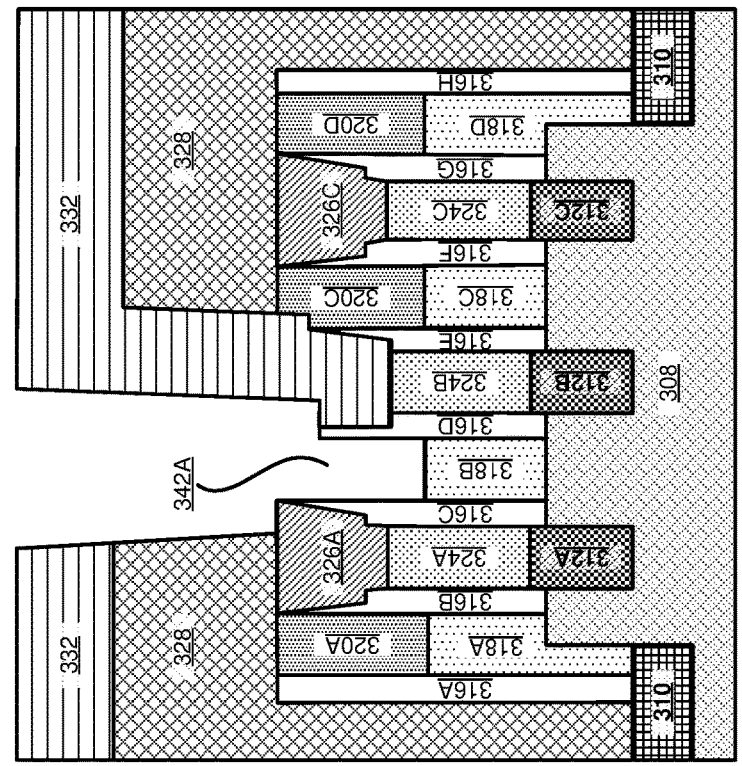

With reference to FIG. 11, this figure depicts a cross-section view of another portion of the process in which a structure 1100 is formed according to an illustrative embodiment. FIG. 11 shows a top view 1102 of structure 1100, a cross-section view of cross couple region 1104, and a cross-section view of normal CA/CB region 1106. In the embodiment, fabrication system 107 removes second SAC cap 320B to form cross couple contact trench 342A in cross couple region 1104, and removes sixth SAC cap 320F to form gate contact (CB) trench 342B in normal CA/CB region 1106. In a particular embodiment, fabrication system 107 removes second SAC cap 320B and sixth SAC cap 320F using a SiN open process selective to SiC.

Figure 12:
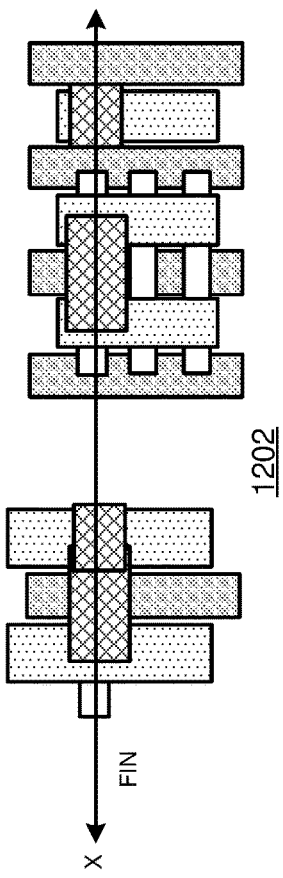
FIG. 12 depicts a cross-section view of another portion of the process in which a structure is formed according to an illustrative embodiment.
Figure 12:
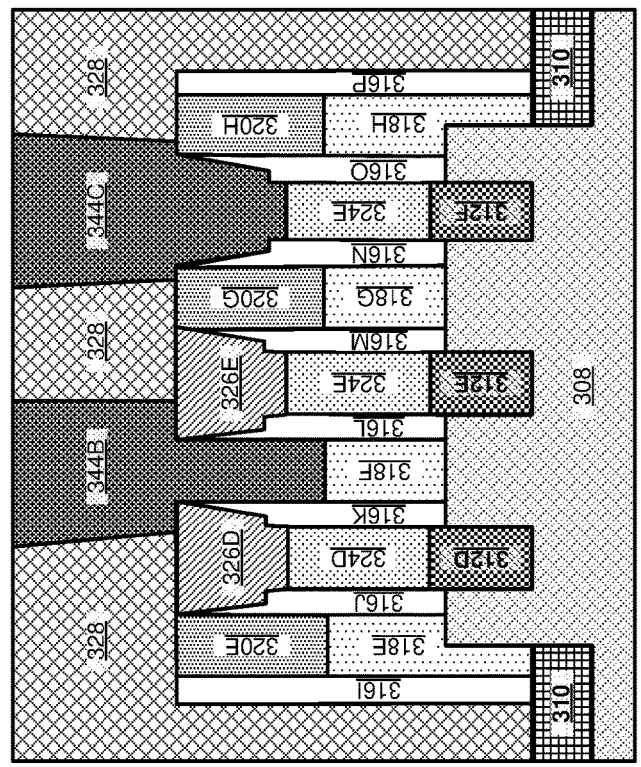
Figure 12:
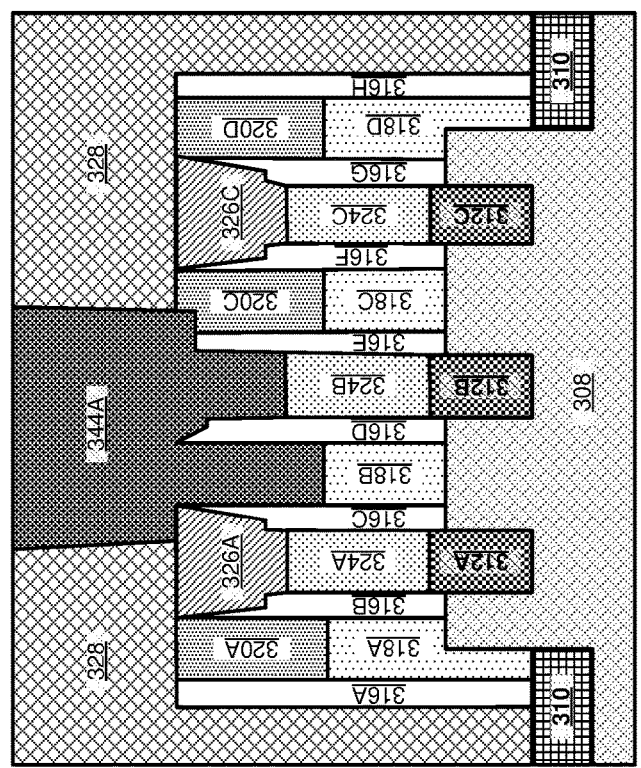

With reference to FIG. 12, this figure depicts a cross-section view of another portion of the process in which a structure 1200 is formed according to an illustrative embodiment. FIG. 12 shows a top view 1202 of structure 1200, a cross-section view of cross couple region 1204, and a cross-section view of normal CA/CB region 1206. In the embodiment, fabrication system 107 removes second lithographic patterning stack 332. In a particular embodiment, fabrication system 107 removes second lithographic patterning stack 332 using an OPL stripping process. In the embodiment, fabrication system 107 deposits a cross couple contact material 344A in cross couple contact trench 342A in contact with second gate 318B and second trench contact 324B of cross couple region 1204. In the embodiment, fabrication system 107 deposits a gate contact (CB) material 344B within gate contact (CB) trench 342B in contact with sixth gate 318F, and deposits a S/D contact material 344C within S/D contact (CA) trench 330B of normal CA/CB region 1206. In a particular embodiment, cross couple contact material 344A, gate contact (CB) material 344B, S/D contact material 344C include a metal material.

Figure 13:
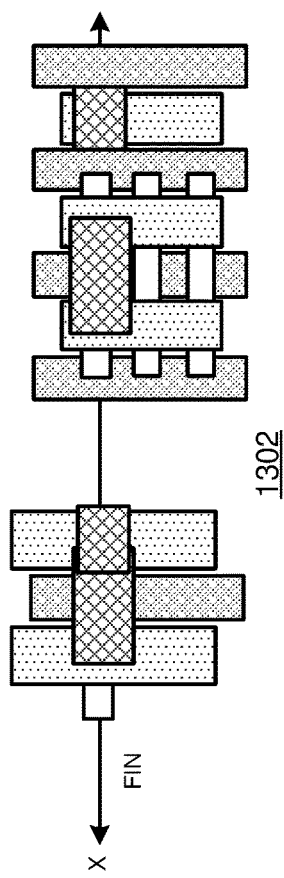
FIG. 13 depict a cross-section view of another portion of the process in which a structure is formed according to an illustrative embodiment.
Figure 13:
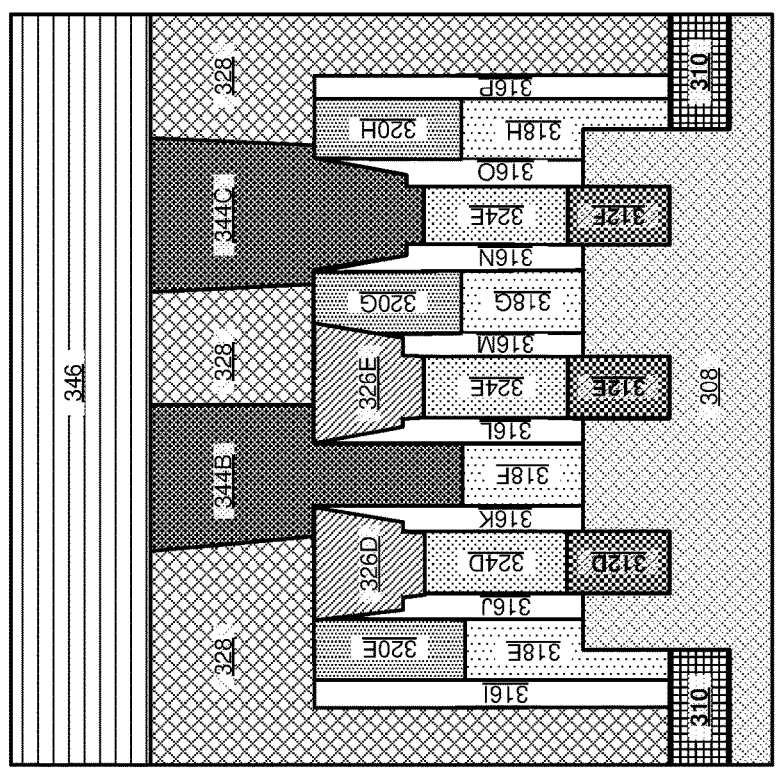
Figure 13:
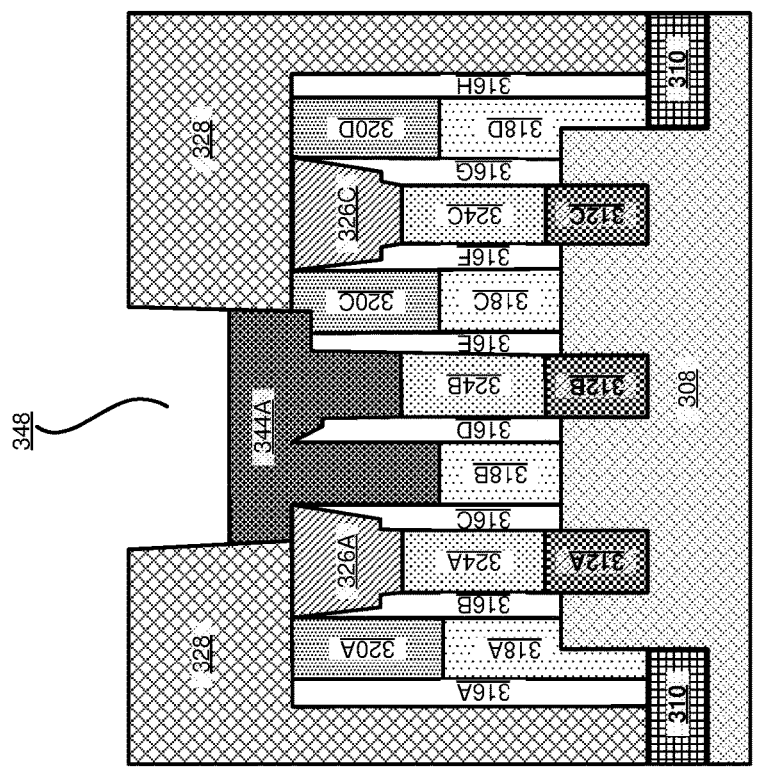

With reference to FIG. 13, this figure depicts a cross-section view of another portion of the process in which a structure 1300 is formed according to an illustrative embodiment. FIG. 13 shows a top view 1302 of structure 1300, a cross-section view of cross couple region 1304, and a cross-section view of normal CA/CB region 1306. In the embodiment, fabrication system 107 applies a block mask 346 to normal CA/CB region 1306 and recesses cross couple contact material 344A of cross couple region 1304 to form a recess 348 within cross couple contact material 344A.

Accordingly, a cross couple contact 344A is formed coupling S/D regions and gate regions of cross couple region 1304.

Figure 14:
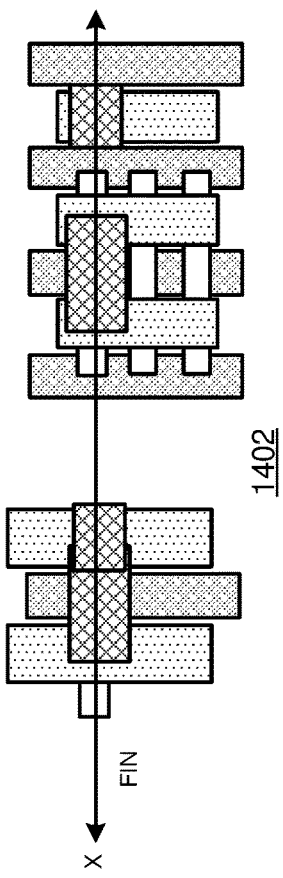
FIG. 14 depicts a cross-section view of another portion of the process in which a structure is formed according to an illustrative embodiment.
Figure 14:
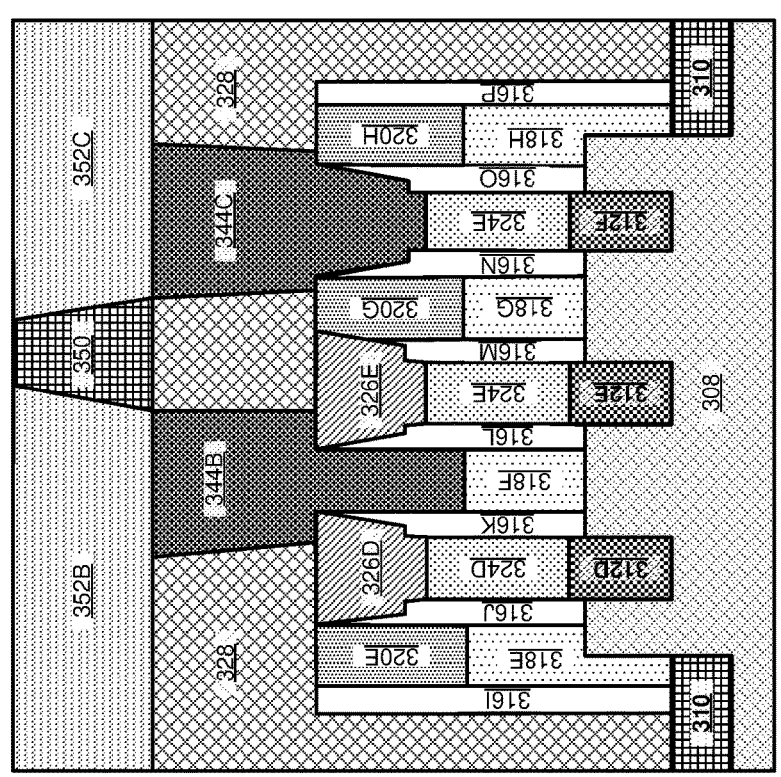
Figure 14:
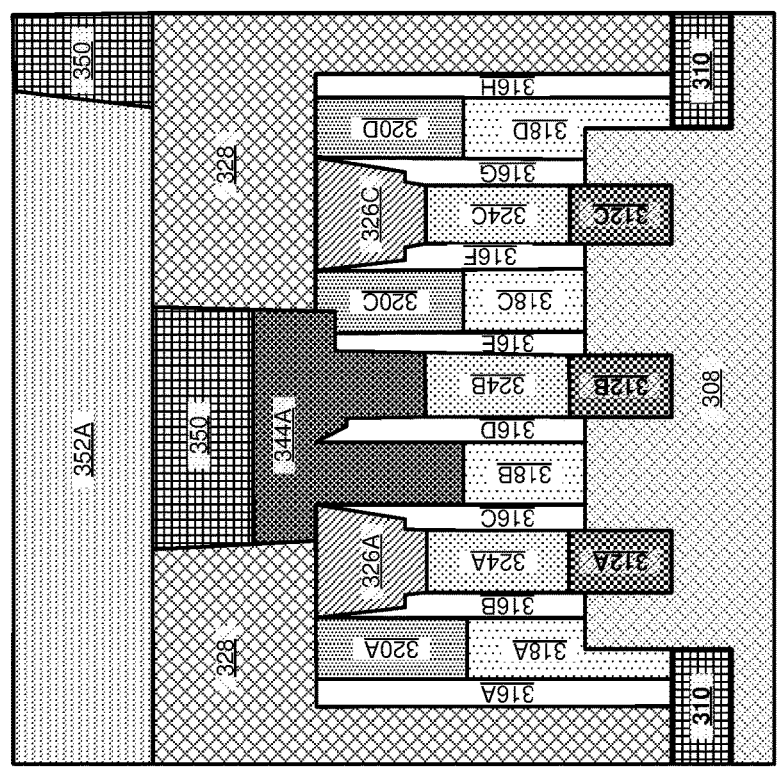

With reference to FIG. 14, this figure depicts a cross-section view of another portion of the process in which a structure 1400 is formed according to an illustrative embodiment. FIG. 14 shows a top view 1402 of structure 1400, a cross-section view of cross couple region 1404, and a cross-section view of normal CA/CB region 1406. In the embodiment, fabrication system 107 removes block mask 346 from normal CA/CB region 1406, and deposits an ILD fill 350 upon cross couple region 1404 and normal CA/CB region 1406. In the embodiment, fabrication system 107 forms a first metallization layer (MO) contact 352A within ILD fill 350 over cross couple region 1404. In the embodiment, first metallization layer (MO) contact 352A is electrically isolated from cross couple contact 344A. In the embodiment, fabrication system 107 forms a second metallization layer (MO) contact 352B within ILD fill 350 in contact with gate contact (CB) 344B, and a third metallization layer (MO) contact 352C within ILD fill 350 in contact with S/D contact 344C of normal CA/CB region 1406.

Figure 15:
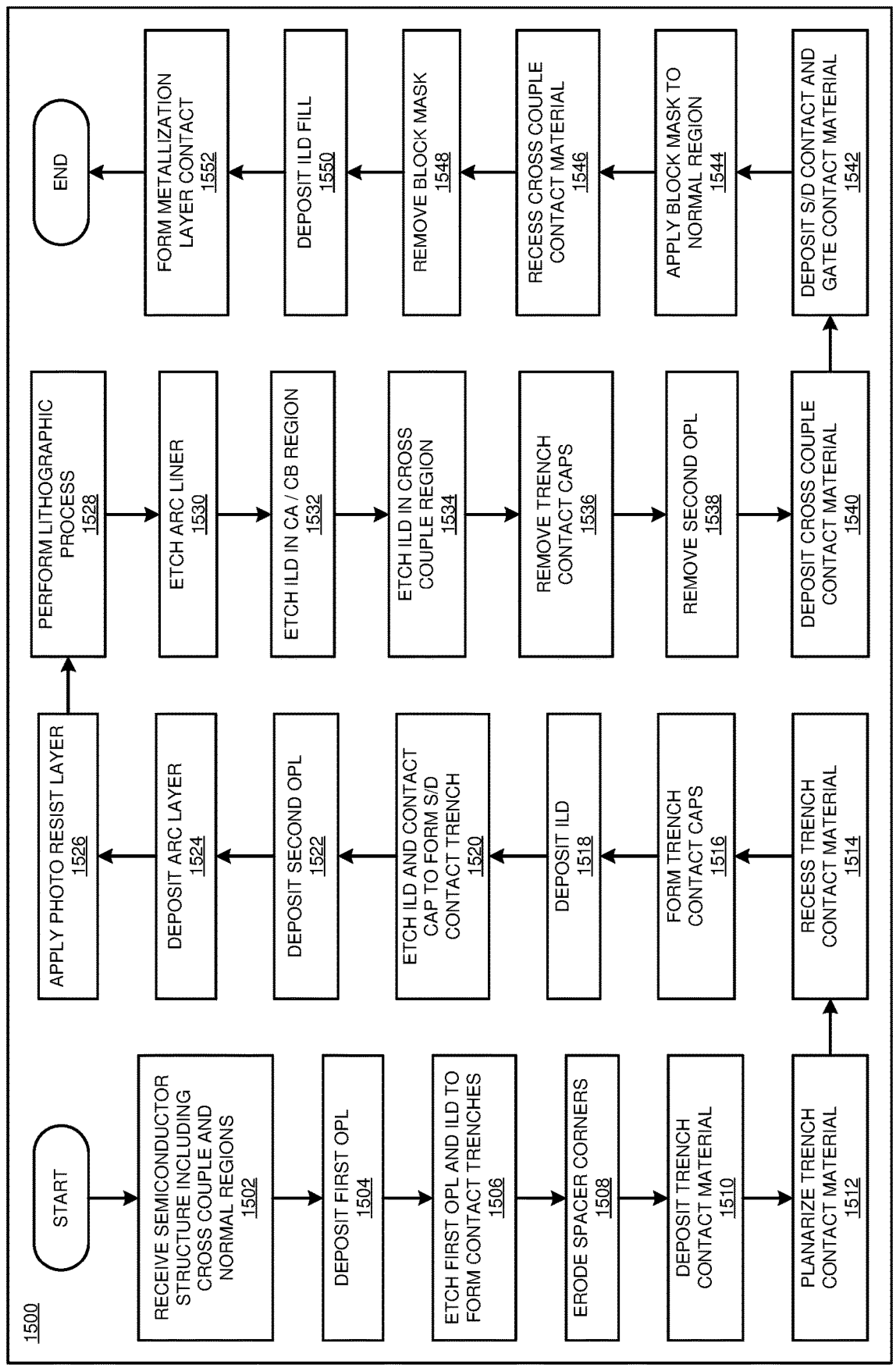
FIG. 15 depicts a flowchart of an example process for fabricating a transistor with a recessed cross couple for gate contact over active region integration according to an illustrative embodiment.

With reference to FIG. 15, this figure depicts a flowchart of an example process 1500 for fabricating a transistor with a recessed cross couple for gate contact over active region integration according to an illustrative embodiment. In block 1502, fabrication system 107 receives a semiconductor structure 300 including cross couple region 304 and normal CA/CB region 306. In the embodiment, structure 300 includes substrate 308, STI layer 310, S/D epitaxies 312A-312C disposed within substrate 308 of cross couple region 304, and S/D epitaxies 312D-312F disposed within substrate 308 of normal CA/CB region 306. Structure 300 further includes ILD 314 disposed upon portions of STI 310 at the left and the right side of each of cross couple region 304 and normal CA/CB region 306, and each S/D epitaxy 312A-312F. Structure 300 further includes spacers 316A-316H within cross couple region 304, and spacers 316I-316P within normal CA/CB region 306 as described herein. Structure 300 further includes gates 318A-318H and SAC caps 320A-320H.

In block 1504, fabrication system 107 deposits first lithographic patterning stack material 322, such as a first OPL, on ILD 314. In block 1506, fabrication system 107 etches first lithographic patterning stack material 322 and ILD 314 to form contact trenches extending to each of S/D epitaxies 312A-312F in cross couple region 404 and normal CA/CB region 406. In an embodiment, first lithographic patterning stack material 322 is removed. In block 1508, fabrication system 107 erodes a corner of each of spacers 316B-316G of cross couple region 404 and a corner of each of spacers of 316J-316O of normal CA/CB region 406.

In block 1510, fabrication system 107 deposits a trench contact material 324 in the trenches in contact with each of first S/D epitaxy 312A, second S/D epitaxy 312B, third S/D epitaxy 312C, fourth S/D epitaxy 312D, fifth S/D contact 312E, and sixth S/D epitaxy 312F to metallize contacts 312A-312F. In block 1512, fabrication system 107 planarizes trench contact material 324.

In block 1514, fabrication system 107 recesses trench contact material 324 to form trench contacts 324A-324F upon S/D epitaxy 312A-312F, respectively. In block 1516, fabrication system 107 forms a trench contact caps 326A-326F on trench contacts 324A-324F, respectively.

In block 1518, fabrication system 107 deposits a second ILD 328 on the semiconductor structure. In block 1520, fabrication system 107 etches second ILD 328 and second trench contact cap 326B to form first source/drain contact (CA) trench 330A to second trench contact 324B of cross couple region 704, and etches second ILD 328 and sixth trench contact cap 326F to form second source/drain contact (CA) trench 330B to sixth trench contact 324F of normal CA/CB region 706.

In block 1522, fabrication system 107 deposits second lithographic patterning stack material 332, such as a second OPL, upon second ILD 328 and within first S/D contact (CA) trench 330A and second S/D contact (CA) trench 330B. In block 1524, fabrication system 107 further 107 deposits ARC material layer 334 on second lithographic patterning stack material 332. In block 1526, fabrication system 107 further applies a first photo resist layer 336 over ARC material layer 334. In block 1528, fabrication system 107 performs a lithography exposure and development process to remove unwanted portions of first photo resist layer 336.

In block 1530, fabrication system 107 etches ARC material layer 334 and second lithographic patterning stack 332. In block 1532, fabrication system 107 etches second ILD 328 in normal CA/CB region 906 to form a portion of gate (CB) contact trench portion 338B. In block 1534, fabrication system 107 etches second ILD 328 in cross couple region 904 to form a portion of cross couple contact trench portion 338A.

In block 1536, fabrication system 107 removes second SAC cap 320B to form cross couple contact trench 342A in cross couple region 1104, and removes sixth SAC cap 320F to form gate contact (CB) trench 342B in normal CA/CB region 1106.

In block 1538, fabrication system 107 removes second lithographic patterning stack material 332. In block 1540, fabrication system 107 deposits cross couple contact material 344A in cross couple contact trench 342A in contact with second gate 318B and second trench contact 324B of cross couple region 1204. In block 1542, fabrication system 107 deposits S/D contact material 344C within S/D contact (CA) trench 330B and gate contact (CB) material 344B within gate contact (CB) trench 342B in contact with sixth gate 318F of normal CA/CB region 1206.

In block 1544, fabrication system 107 applies a block mask 346 to normal CA/CB region 1306. In block 1546, fabrication system 107 recesses cross couple contact material 344A of cross couple region 1304 to form a recess 348 within cross couple contact material 344A. Accordingly, cross couple contact 344A is formed coupling S/D regions and gate regions of cross couple region 1304.

In block 1548, fabrication system 107 removes block mask 346 from normal CA/CB region 1406. In block 1550, fabrication system 107 deposits an ILD fill 350 upon cross couple region 1404 and normal CA/CB region 1406. In block 1552, fabrication system 107 forms first metallization layer (MO) contact 352A within ILD fill 350 of cross couple region 1404, second metallization layer (MO) contact 352B within ILD fill 350 in contact with gate contact (CB) 344B of normal CA/CB region 1406, and third metallization layer (MO) contact 352C within ILD fill 350 in contact with S/D contact 344C of normal CA/CB region 1406. In the embodiment, first metallization layer (MO) contact 352A is electrically isolated from cross couple contact 344A. Process 1500 then ends.

Thus, a computer implemented method is provided in the illustrative embodiments for fabricating a transistor with a recessed cross couple for gate contact over active region integration according to an illustrative embodiment in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus comprising:
   a semiconductor structure including a substrate having a first region and a second region;
   a first source/drain disposed on the substrate in the first region;
   an interlevel dielectric (ILD) disposed on the source/drain;
   a first gate disposed on the substrate;
   a first spacer disposed between the first source/drain and the first gate;
   a first contact trench within the ILD extending to the first source/drain;
   a first trench contact within the first contact trench;
   a first source/drain contact trench extending to the first trench contact;
   a cross couple contact trench within the ILD; and
   a cross couple contact disposed in the cross couple contact trench in contact with the first gate and the first trench contact, the cross couple contact coupling the first source/drain and the first gate such that the cross couple contact is substantially connected to a singular surface of the first source/drain.

2. The apparatus of claim 1, further comprising:
   a first cap disposed on the first gate.

3. The apparatus of claim 1, further comprising:
   an ILD fill upon the semiconductor structure; and
   a first metallization layer within the ILD fill of the first region, wherein the first metallization layer is electrically isolated from the cross couple contact.

4. The apparatus of claim 1, further comprising:
   a second source/drain disposed on the substrate in the second region;
   a second contact trench within the ILD extending to the second source/drain; and
   a second trench contact within the second contact trench such that the second trench contact is substantially connected to a singular surface of the second source/drain.

5. The apparatus of claim 1, further comprising:
   an anti-reflective coating material layer disposed over the semiconductor structure.

6. The apparatus of claim 1, further comprising:
   an ILD fill material disposed over the semiconductor structure.

7. The apparatus of claim 1, further comprising:
   a first metallization layer deposed within the ILD, wherein the first metallization layer is electrically isolated from the cross couple contact.

8. The apparatus of claim 1, further comprising:
   a second contact trench within the ILD extending to a second source/drain of the second region.

9. The apparatus of claim 8, further comprising:
   a second trench contact within the second contact trench.

* * * * *